United States Patent
Singleton et al.

(10) Patent No.: US 9,230,575 B2
(45) Date of Patent: Jan. 5, 2016

(54) MAGNETORESISTIVE SENSOR WITH SAF STRUCTURE HAVING CRYSTALLINE LAYER AND AMORPHOUS LAYER

(71) Applicant: Seagate Technology LLC, Cupertino, CA (US)

(72) Inventors: Eric W. Singleton, Maple Plain, MN (US); Liwen Tan, Eden Prairie, MN (US); Jae-Young Yi, Prior Lake, MN (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 0 days.

(21) Appl. No.: 14/105,922

(22) Filed: Dec. 13, 2013

(65) Prior Publication Data

US 2015/0170686 A1    Jun. 18, 2015

(51) Int. Cl.
| | |
|---|---|
| *G11B 5/11* | (2006.01) |
| *G11B 5/39* | (2006.01) |
| *G01R 33/09* | (2006.01) |
| *H01L 43/08* | (2006.01) |
| *G01R 33/00* | (2006.01) |
| *G01R 33/025* | (2006.01) |

(52) U.S. Cl.
CPC ............ *G11B 5/3912* (2013.01); *G01R 33/007* (2013.01); *G01R 33/025* (2013.01); *G01R 33/098* (2013.01); *G11B 5/398* (2013.01); *H01L 43/08* (2013.01); *G11B 2005/3996* (2013.01); *Y10T 428/1121* (2015.01)

(58) Field of Classification Search
CPC ...................................................... G11B 5/3912
USPC .......................................................... 360/319
See application file for complete search history.

(56) References Cited

U.S. PATENT DOCUMENTS

| | | | |
|---|---|---|---|
| 6,356,419 B1* | 3/2002 | Gill ..................... | G11B 5/3903 |
| | | | 360/324.11 |
| 8,270,125 B2 | 9/2012 | Gill | |
| 8,531,801 B1 | 9/2013 | Xiao et al. | |
| 8,638,530 B1* | 1/2014 | Hsu et al. ....................... | 360/319 |
| 2003/0058584 A1* | 3/2003 | Koike ........................... | 360/319 |
| 2011/0051291 A1* | 3/2011 | Miyauchi et al. ............. | 360/319 |
| 2012/0280773 A1* | 11/2012 | Singleton et al. ............. | 335/301 |
| 2013/0094108 A1 | 4/2013 | Gao et al. | |
| 2014/0293474 A1* | 10/2014 | Yamane et al. ................ | 360/319 |

FOREIGN PATENT DOCUMENTS

| | | |
|---|---|---|
| EP | 1693854 A2 | 8/2006 |
| JP | 2009-272031 A | 11/2009 |
| JP | 2013-008439 A | 1/2013 |

* cited by examiner

*Primary Examiner* — Craig A. Renner
(74) *Attorney, Agent, or Firm* — HolzerIPLaw, PC

(57) ABSTRACT

Implementations disclosed herein provide for a magnetoresistive (MR) sensor including a synthetic antiferromagnetic (SAF) structure that is magnetically coupled to a side shield element. The SAF structure includes at least one magnetic amorphous layer that is an alloy of a ferromagnetic material and a refractory material. The amorphous magnetic layer may be in contact with a non-magnetic layer and antiferromagnetically coupled to a layer in contact with an opposite surface of the non-magnetic layer.

20 Claims, 6 Drawing Sheets

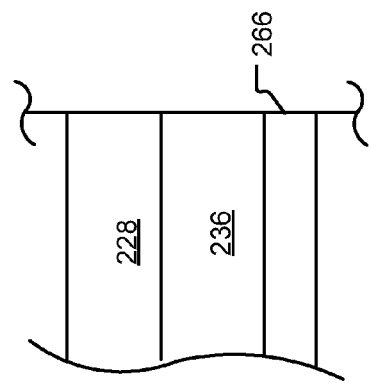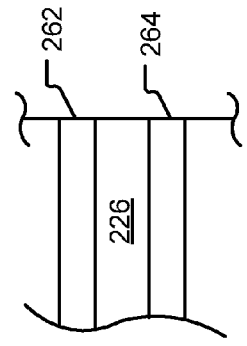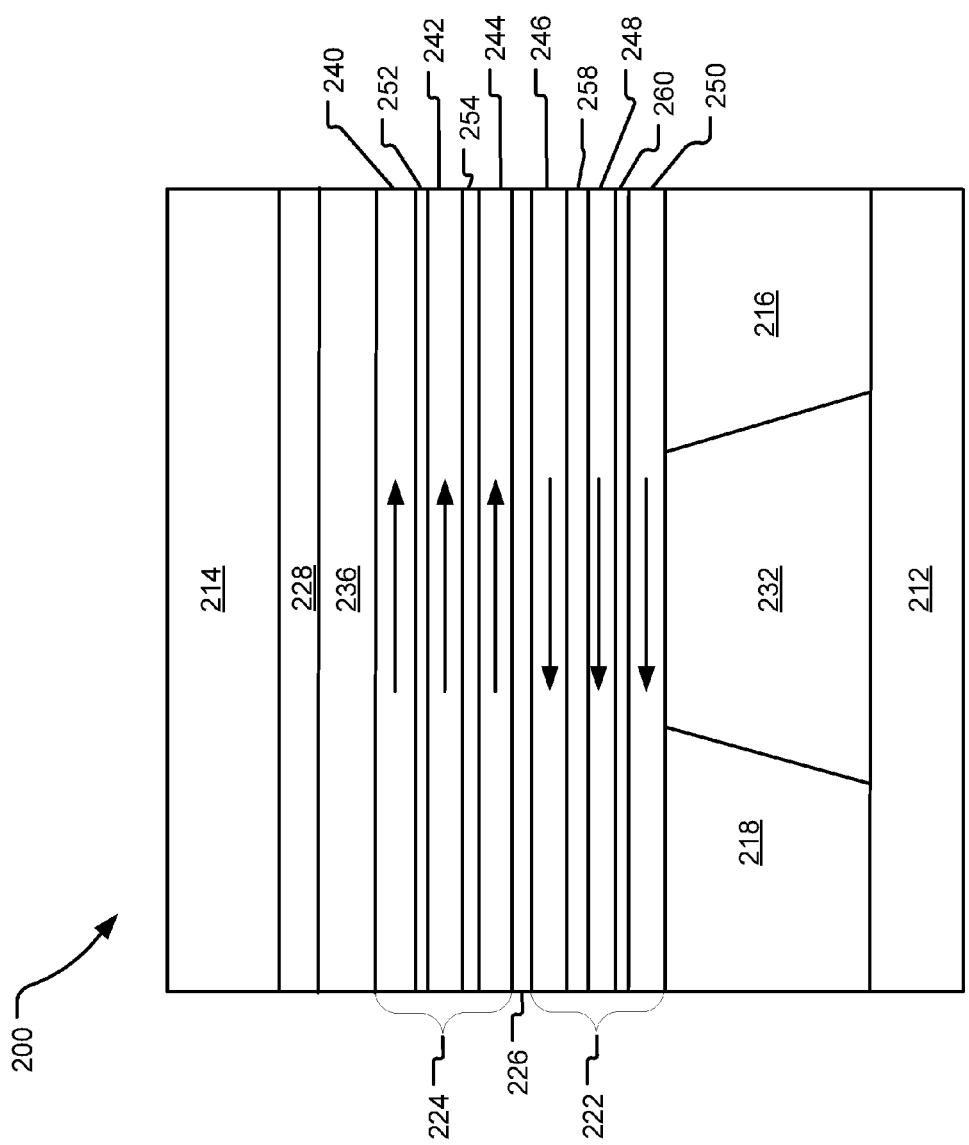

MAGNETORESISTIVE SENSOR WITH SAF STRUCTURE HAVING CRYSTALLINE LAYER AND AMORPHOUS LAYER

BACKGROUND

Generally, magnetic hard disc drives include transducer heads that read and write data encoded in tangible magnetic storage media. Magnetic flux detected from the surface of the magnetic medium causes rotation of a magnetization vector of a sensing layer or layers within a magnetoresistive (MR) sensor within the transducer head, which in turn causes a change in electrical resistivity of the MR sensor. The change in resistivity of the MR sensor can be detected by passing a current through the MR sensor and measuring the resulting change in voltage across the MR sensor. Related circuitry can convert the measured voltage change information into an appropriate format and manipulate that information to recover the data encoded on the disc.

As improvements in magnetic recording density capabilities are pursued, the dimensions of transducer heads continue to shrink. Typically, transducer heads are formed as a thin film multilayer structure having an MR sensor, among other structures. In some approaches, the thin film multilayer structure includes a synthetic anti-ferromagnet (SAF) to enhance MR sensor stability. However, existing thin film process and structure designs used in forming SAF-based MR sensors present effects that can nevertheless limit MR sensor performance and stability.

SUMMARY

Implementations described and claimed herein provide a synthetic antiferromagnetic (SAF) structure magnetically coupled a side shield element, the SAF structure including at least one amorphous alloy layer that includes a ferromagnetic material and a refractory material.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

BRIEF DESCRIPTIONS OF THE DRAWINGS

FIG. 1 illustrates a plan view of an example disk drive assembly and an example MR sensor.

FIG. 2A illustrates another example MR sensor including a synthetic antiferromagnetic structure with crystalline magnetic material in contact with a coupling spacer layer, FIG. 2B illustrates a partial view of an example MR sensor including a synthetic antiferromagnetic structure with amorphous magnetic material in contact with a coupling spacer layer, and FIG. 2C illustrates a partial view of an example MR sensor including a synthetic antiferromagnetic structure with amorphous magnetic material in contact with an AFM layer.

DETAILED DESCRIPTION

Reducing cross-track magnetic interference is one challenge in creating storage devices with higher areal densities. Some magnetoresistive (MR) sensor designs utilize side shields to reduce cross-track magnetic interference; however, side shields can be sensitive to variation in stray magnetic fields. This sensitivity can result in free layer bias variability within the MR sensor, which can consequentially decrease a signal to noise (SNR) ratio of the MR sensor.

To help stabilize side shields, a pinned synthetic antiferromagnetic (SAF) structure can be incorporated into a shield element proximal to a leading or trailing edge of a sensor stack. The SAF structure is magnetically coupled to the side shields and includes at least two ferromagnetic layers antiferromagnetically coupled together across a non-magnetic spacer coupling layer.

In the above-described sensor design, the strength of the antiferromagnetic coupling in the SAF structure plays a major role in stabilization of the SAF structure and in the stabilization of the side shields. When the interface between the spacer coupling layer and the ferromagnetic layers is rough, the strength of the ferromagnetic coupling within the SAF structure is reduced. This contributes to a reduction in side shield stability, and ultimately to an increase in noise of the MR sensor.

Implementations disclosed herein provide for an SAF structure with one or more ferromagnetic coupling layers comprising a magnetic amorphous alloy. The magnetic amorphous alloy contributes to a "smoother" interface between the ferromagnetic layers and the spacer coupling layer. As a result, the MR sensor exhibits increased stability and a reduction in cross-track magnetic interference.

The technology disclosed herein may be used in conjunction with a variety of different types of MR sensors (e.g., anisotropic magnetoresistive (AMR) sensors, tunneling magnetoresistive (TMR) sensors, giant magnetoresistive (GMR) sensors, etc.). Accordingly, the implementations disclosed herein may also be applicable to new MR sensor designs that are based on new physical phenomena such as lateral spin valve (LSV), spin-hall effect (SHE), spin torque oscillation (STO), etc.

Figure 1:
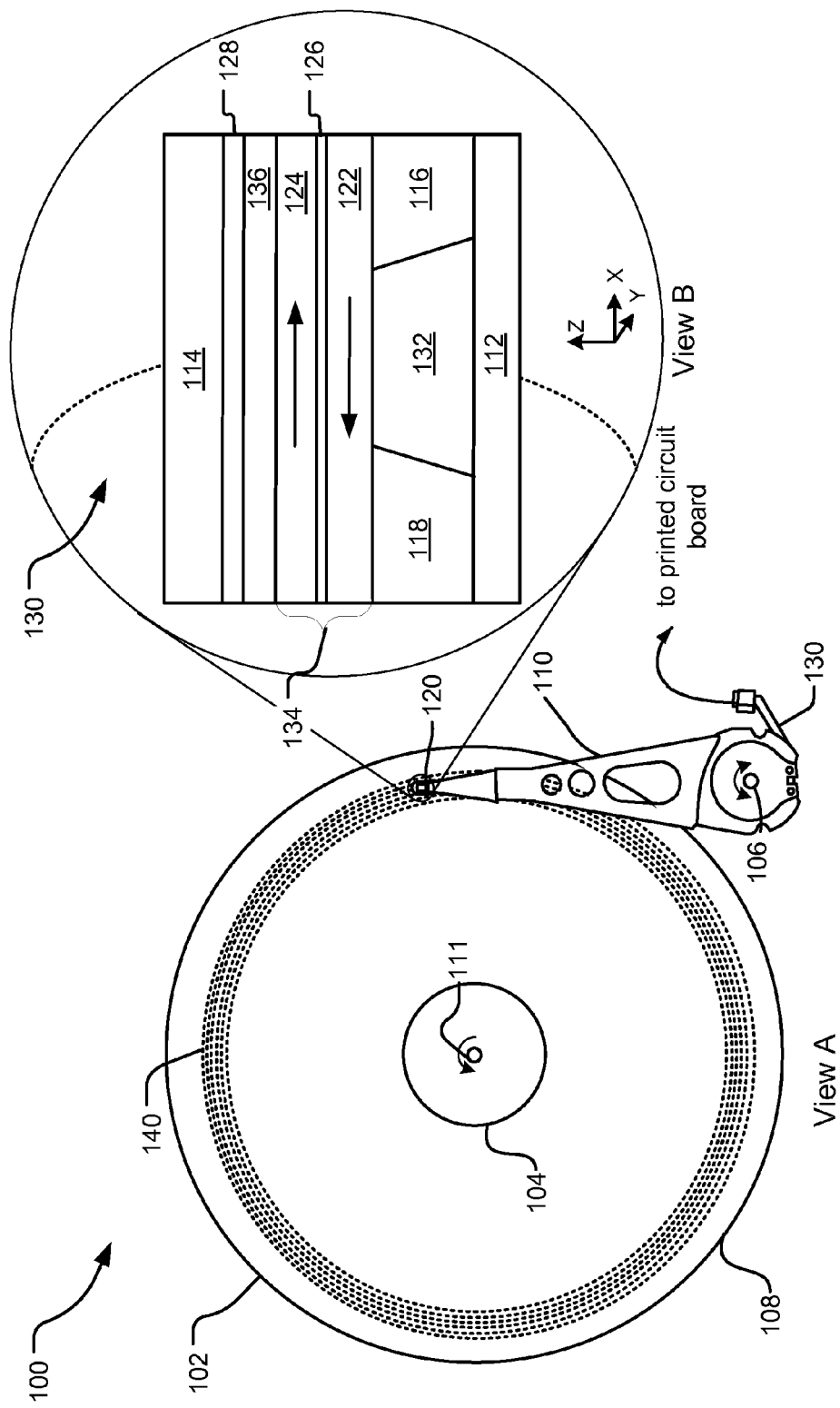

FIG. 1 illustrates a plan view of an example disk drive assembly 100. The example disk drive assembly 100 includes a slider 120 on a distal end of an actuator arm 110 positioned over a media disk 108. A rotary voice coil motor that rotates about an actuator axis of rotation 106 is used to position the slider 120 on a data track (e.g., a data track 140) and a spindle motor that rotates about disk axis of rotation 111 is used to rotate the media disk 108. Referring specifically to View A, the media disk 108 includes an outer diameter 102 and an inner diameter 104 between which are a number of data tracks, such as a data track 140, illustrated by circular dotted lines. A flex cable 130 provides the requisite electrical connection paths for the slider 120 while allowing pivotal movement of the actuator arm 110 during operation.

The slider 120 is a laminated structure with a variety of layers performing a variety of functions. The slider 120 includes a writer section (not shown) and one or more MR sensors for reading data off of the media disk 108. View B illustrates a side of an example MR sensor 130 that faces an air-bearing surface (ABS) of the media disk 108 when the disk drive assembly 100 is in use. Thus, the MR sensor 130 shown in View B may be rotated by about 180 degrees about (e.g., about a z-axis) when operationally attached to the slider 120 shown in View A.

The MR sensor 130 of the slider 120 includes a sensor stack 132 that has a plurality of layers (not shown) that perform a plurality of functions. In various implementations, the functionality and number of such layers may vary. However, the sensor stack 132 includes at least a magnetic layer with a magnetic moment that is free to rotate in response to an applied magnetic field (i.e., a free layer (not shown)). The data bits on the media disk 108 are magnetized in a direction normal to the plane of FIG. 1, either into the plane of the figure, or out of the plane of the figure. Thus, when the MR sensor 130 passes over a data bit, the magnetic moment of the free layer is rotated either into the plane of FIG. 1 or out of the plane of FIG. 1, changing the electrical resistance of the MR sensor 130. The value of the bit being sensed by the MR sensor 130 (e.g., either 1 or 0) may therefore be determined based on the current flowing through the sensor stack 132.

Side shield elements 116 and 118 provide a stabilizing bias to the free layer of the sensor stack 132. The side shields 116 and 118 are positioned adjacent to the sensor stack 132 in the cross-track (x-direction), and may be made of soft or hard magnetic material.

In the down-track direction (z-direction), the sensor stack 132 is positioned between shield elements 112 and 114. The shield elements 112 and 114 isolate the sensor stack 132 from electromagnetic interference, primarily z-direction interference, and serve as electrically conductive first and second electrical leads connected to processing electronics (not shown). In one implementation, the shield elements 112, 114 are constructed of a soft magnetic material (e.g., a Ni—Fe alloy). In another implementation, the shield elements 112, 114 have a z-direction thickness that is substantially larger than the length of a single data bit on a rotating magnetic media. Such thickness may be on the order of 1-2 microns (e.g., approximately one micron) along the data track 140.

In operation, a bit along a track 140 on the media disk 108 consecutively passes under the shield element 112, under the sensor stack 132, and then under the shield element 114. Therefore, the edge of the sensor stack 132 proximal to the shield element 112 may be referred to as the "leading edge" of the sensor stack and the edge of the sensor stack 132 proximal to the shield element 114 may be referred to as the "trailing edge" of the sensor stack.

In FIG. 1, the leading edge of the sensor stack 132 is in contact with the shield element 112. In other implementations, one or more layers may be interleaved between the sensor stack 132 and the shield element 112.

The trailing edge of the sensor stack is 132 is adjacent to a synthetic antiferromagnetic (SAF) structure 134, which includes a pinned layer 124, a reference layer 122, and a spacer coupling layer 126. The pinned layer 124 has a magnetic moment that is biased by an adjacent antiferromagnetic (AFM) layer 136. The direction of such biasing (indicated by an arrow in the pinned layer 124) is in a direction that is substantially antiparallel to the magnetic orientation of the reference layer 122. These antiparallel magnetic orientations are due to an antiferromagnetic coupling across the spacer coupling layer 126, which may be a layer of ruthenium or other suitable Ruderman-Kittel-Kasuya-Yosida (RKKY) coupling material.

The pinned layer 124 and the reference layer 122 may be made of the same or different materials. In one implementation, one or both of the pinned layer 124 and the reference layer 122 are magnetic amorphous alloys including a ferromagnetic material (e.g., Co, Fe, CoFe, NiFe, etc.), and a refractory material, such as tantalum (Ta), niobium (Nb), hafnium (Hf), and zirconium (Zr).

For example, the magnetic amorphous alloy may be CoFeX or NiFeX, where X is a refractory material. In one implementation, the magnetic amorphous alloy includes between 0 and about 30% of the refractory material, or enough to ensure that the resulting alloy is amorphous. In one example implementation, the magnetic amorphous alloy is CoFeNb and comprises 10% Nb. The percent of refractory material included in the amorphous magnetic material is a variable value that may depend upon material types utilized as well as process conditions, such as an annealing temperature.

As used herein, "amorphous" refers to a solid that lacks the long-range order characteristic of a crystal. The magnetic amorphous alloy may be deposited as a thin film and remain amorphous during post-deposition processing, such as during a magnetic annealing process. Suitable magnetic amorphous alloys exhibit one or more of the following properties: magnetic softness, relatively low magnetostriction, high magnetic moments, and a mill rate that is substantially the same as the mill rate of one or more other soft magnetic materials (e.g., NiFe, CoFe) used in the MR sensor 130. In one implementation, a suitable magnetic amorphous alloy has a magnetostriction coefficient between $-1 \times 10^{-5}$ and $1 \times 10^{-5}$. In another implementation, a suitable magnetic amorphous alloy has a magnetic moment that is greater than the magnetic moment of ferromagnetic material included in the magnetic amorphous alloy. For example, the magnetic amorphous alloy may include NiFe combined with other material, and have a total magnetic moment greater than the magnetic moment of NiFe alone.

Using a magnetic amorphous alloy for the pinned layer 124 and/or the reference layer 122 instead of a crystalline material allows for a smoother interface with the spacer coupling layer 126. This smoother interface increases the strength of the antiferromagnetic coupling between the pinned layer 124 and the reference layer 122, which correlates to an increase in stability of the MR sensor 130.

Using a magnetic amorphous material rather than a crystalline material for the pinned layer 124 also allows for a smoother interface between the pinned layer 124 and an adjacent antiferromagnetic (AFM) layer 136. The AFM layer 136 biases the magnetic orientation of the pinned layer 124 in a direction perpendicular to an air-bearing surface (ABS) of the MR sensor 130. A stronger biasing of the pinned layer 124 can be achieved when the interface with the AFM layer 136 is smooth, rather than rough.

A capping layer 128 is in contact with the AFM layer 136 and serves to magnetically decouple the AFM layer 136 from the adjacent shield element 114.

In at least one implementation, the amorphous magnetic material does not include a glass-former. A glass former may be, for example, an element conducive to the occurrence of a glass transition in an amorphous solid material. Glass formers include, without limitation, silicon, boron, germanium, titanium, aluminum, zirconium, beryllium, magnesium, zinc, calcium, lead, lithium, sodium, and potassium. Excluding such glass-former elements from the magnetic amorphous alloy may permit the alloy to exhibit an increased magnetic moment as compared to the same or similar alloys including glass formers. This increase in magnetic moment can translate to an increase in sensor stability. Excluding the glass-former elements from the magnetic amorphous alloy also improves the thermal stability of the amorphous layer. Magnetic amorphous alloys that include glass formers may lack stability and crystalize during annealing processes.

FIG. 2A illustrates an ABS-facing view of another example MR sensor 200 including a SAF structure including amorphous magnetic material. The MR sensor 200 includes a sensor stack 232 positioned between side shield elements 216 and 218. The side shields 216 and 218 are positioned adjacent to the sensor stack 232 in the cross-track (x-direction), and may be made of soft or hard magnetic material.

A leading edge of the sensor stack 232 is directly adjacent to a first shield element 212, while a trailing edge of the sensor stack is 232 is directly adjacent to a synthetic antiferromagnetic (SAF) structure including a pinned layer stack 224, a reference layer stack 222, and a spacer coupling layer 226. The SAF structure is magnetically coupled to the side shields 216 and 218.

Each of the pinned layer stack 224 and the reference layer stack 222 includes multiple, alternating layers of crystalline ferromagnetic material and amorphous ferromagnetic material. For example, the pinned layer stack 224 includes two amorphous ferromagnetic layers 252 and 254, each interleaved between a pair of crystalline ferromagnetic layers (e.g., crystalline magnetic layers 240, 242, and 244). Likewise, the reference layer stack 222 includes two amorphous ferromagnetic layers 258 and 260 interleaved between layers of crystalline ferromagnetic layers 246, 248, and 250. Other implementations may include fewer or greater numbers of alternating crystalline ferromagnetic and amorphous ferromagnetic layers.

The crystalline ferromagnetic layers in each of the pinned layer stack 224 and the reference layer stack 222 may be, for example, Ni, Co, NiFe, or CoFe. The amorphous ferromagnetic material is a magnetic amorphous alloy including a ferromagnetic material (such as Ni, Co, NiFe, or CoFe) and a refractory material (such as Ta, Nb, Hf, and Zr). In one implementation, the amorphous ferromagnetic material includes between 0 and about 30% of the refractory material, or enough to ensure that the resulting material is amorphous.

In one implementation, the crystalline ferromagnetic layers 240, 242, 244, 246, 248, and 250 are layers of NiFe and the amorphous ferromagnetic layers 252, 254, 258, and 260 are layers of CoFeX, where X is a refractory material. In another implementation, the amorphous ferromagnetic layers 252, 254, 258, and 260 are layers of CoFeNb.

Depending on design criteria, the z-direction thickness of the crystalline ferromagnetic layers (e.g., the crystalline ferromagnetic layer 240) is about 5 to 10 nm and the z-direction thickness of the amorphous ferromagnetic layers (e.g., the amorphous ferromagnetic layer 252) is about 0.2 to 3 nm.

The layers in the pinned layer stack 224 are magnetically coupled together and magnetically biased by an AFM layer 236 in a direction indicated by arrows in FIG. 2A. Likewise, the layers in the reference layer stack 222 are magnetically coupled together in a direction opposite the magnetic orientation of the pinned layer stack 224. A capping layer 228 magnetically separates the SAF structure from a second shield element 214. Other features of the MR sensor 200 not explicitly described may be the same or similar to features of the MR sensor discussed with respect to FIG. 1.

Inclusion of the amorphous ferromagnetic layers between the crystalline ferromagnetic layers in FIG. 2A may break the grain growth in the crystalline ferromagnetic layers and provide for a smoother interface between the spacer coupling layer 226 and the directly adjacent crystalline ferromagnetic layers 244 and 246. This smoother interface provides for increased coupling strength across the interface that is achieved without degradation to the coupling between the crystalline ferromagnetic layers. In an alternate implementation illustrated in FIG. 2B, amorphous alloy layers 262, 264 are in contact with the spacer coupling layer 226. In another alternate implementation illustrated in FIG. 2C, an amorphous alloy layer 266 is in contact with the AFM layer 236.

In addition to the above-described advantages of the MR sensor 200, the alternating layers of crystalline ferromagnetic material and amorphous ferromagnetic material allow for an increase in the strength of the pinning field between the AFM layer 236 and the directly adjacent pinned layer stack 224, further boosting stability of the MR sensor 200.

Figure 3:
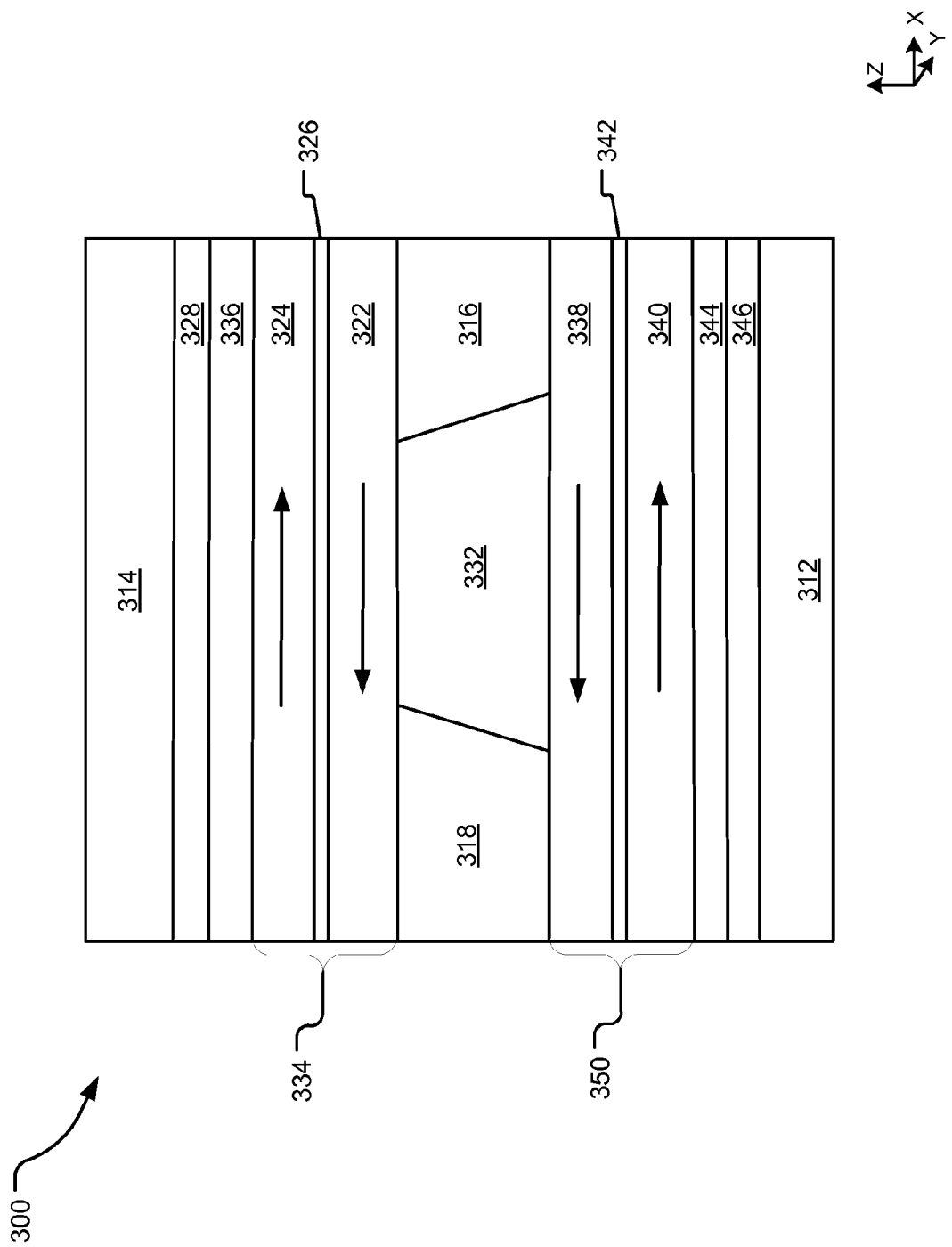
FIG. 3 illustrates an ABS-facing view of another example MR sensor including a first SAF structure and a second SAF structure.

FIG. 3 illustrates an ABS-facing view of another example MR sensor 300 including a first SAF structure 334 and a second SAF structure 350. Each of the first SAF structure 334 and the second SAF structure 350 include a magnetic amorphous alloy formed from a ferromagnetic material and a refractory material. The MR sensor 300 includes a sensor stack 332 sandwiched between side shield elements 316 and 318. The side shields 316 and 318 are positioned adjacent to the sensor stack 332 in the cross-track (x-direction), and may be made of soft or hard magnetic material.

A trailing edge of the sensor stack is 332 is adjacent to the first SAF structure 334. The first SAF structure 334 includes a pinned layer 324, a reference layer 322, and a spacer coupling layer 326. The pinned layer 324 is antiferromagnetically coupled to the reference layer 322 by way of an RKKY coupling provided by the spacer coupling layer 326. A first AFM layer 336 magnetically biases the pinned layer 324, and a capping layer 328 magnetically separates the first SAF structure from a first shield element 314.

A leading edge of the sensor stack is 332 is adjacent to the second SAF structure 350. Like the first SAF structure 334, the second SAF structure 350 includes a pinned layer 340, a reference layer 338, and a spacer coupling layer 342. The pinned layer 340 is antiferromagnetically coupled to the reference layer 338 by way of an RKKY coupling provided by the spacer coupling layer 342. A second AFM layer 344 magnetically biases the pinned layer 340, and a seeding layer 346 magnetically separates the second SAF structure 350 from a second shield element 312. In another implementation, at least one of the first SAF structure 334 and the second SAF structure 350 is a laminated structure.

In another implementation, the MR sensor 300 includes the second SAF structure 350, but excludes the first SAF structure 334.

Figure 4:
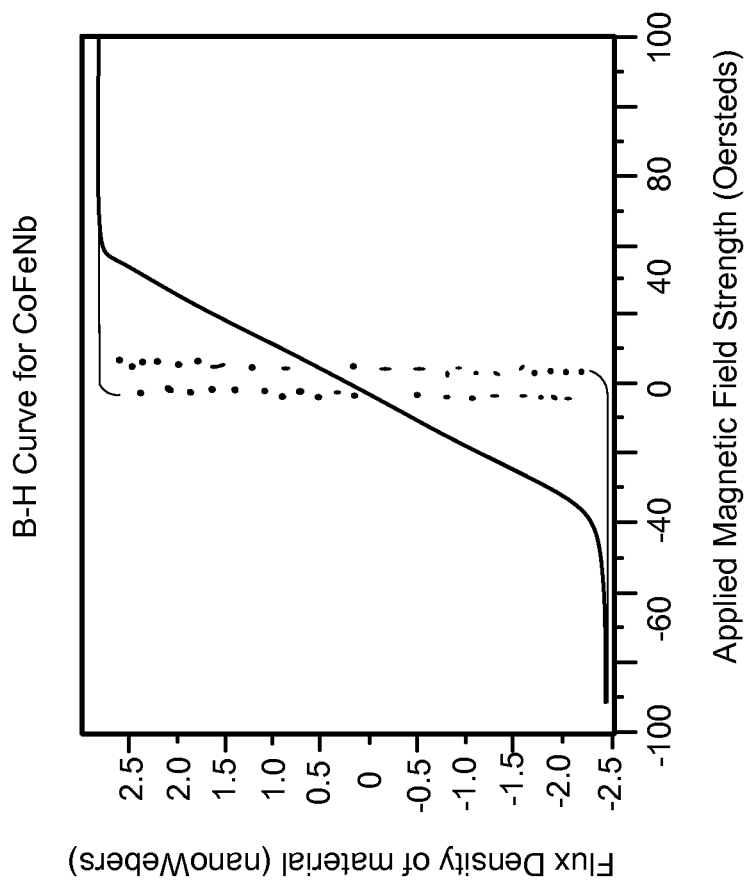
FIG. 4 illustrates magnetization for an amorphous ferromagnetic layer of CoFeNb sheet film under an applied magnetic field.

FIG. 4 illustrates magnetization behavior in the easy and hard axis (i.e., the axes easiest and hardest to magnetically rotate) for an amorphous ferromagnetic layer of CoFeNb sheet film under an applied magnetic field. In the hard axis, where the magnetic field is zero (at the origin), there is no magnetization. However, the magnetization of the amorphous ferromagnetic material increases along with an applied magnetic field until a saturation point, where the applied magnetic field reaches approximately ±50 Oersteds.

Figure 5:
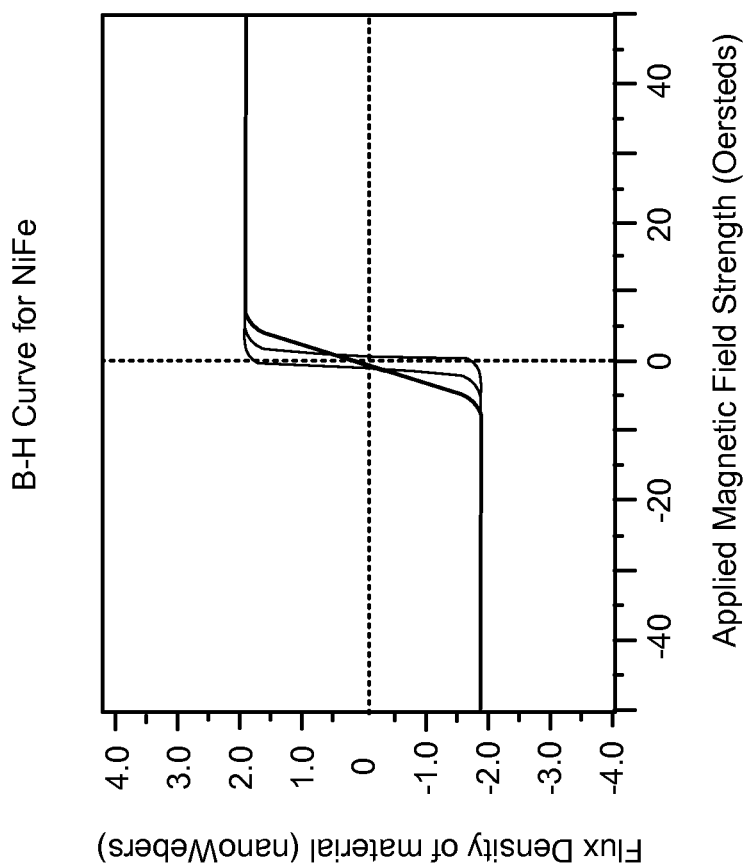
FIG. 5 illustrates magnetization for a crystalline ferromagnetic layer of NiFe under an applied magnetic field.

FIG. 5 illustrates magnetization behavior in the easy and hard axis for a crystalline ferromagnetic of NiFe sheet film under a magnetic field. The layer of NiFe has a thickness of about 10 nm, which is the same or substantially similar to the thickness of the CoFeNb sheet film utilized to produce the data illustrated in FIG. 4. In the hard axis, under an applied magnetic field, the magnetization of the crystalline ferromagnetic material increases until a saturation point at approximately ±5 Oersteds.

Together, FIGS. 4 and 5 demonstrate that fully magnetizing CoFeNb has a higher magnetic anisotropy field (Hk), which requires an applied field of about ten times the strength of the field required to fully saturate NiFe in the hard axis. Thus, an SAF shield including NiFe can be more easily influenced by stray magnetic fields than CoFeNb. Additionally, CoFeNb has a higher magnetic moment than NiFe, which contributes to increased sensor resolution when used as a shield.

Figure 6:
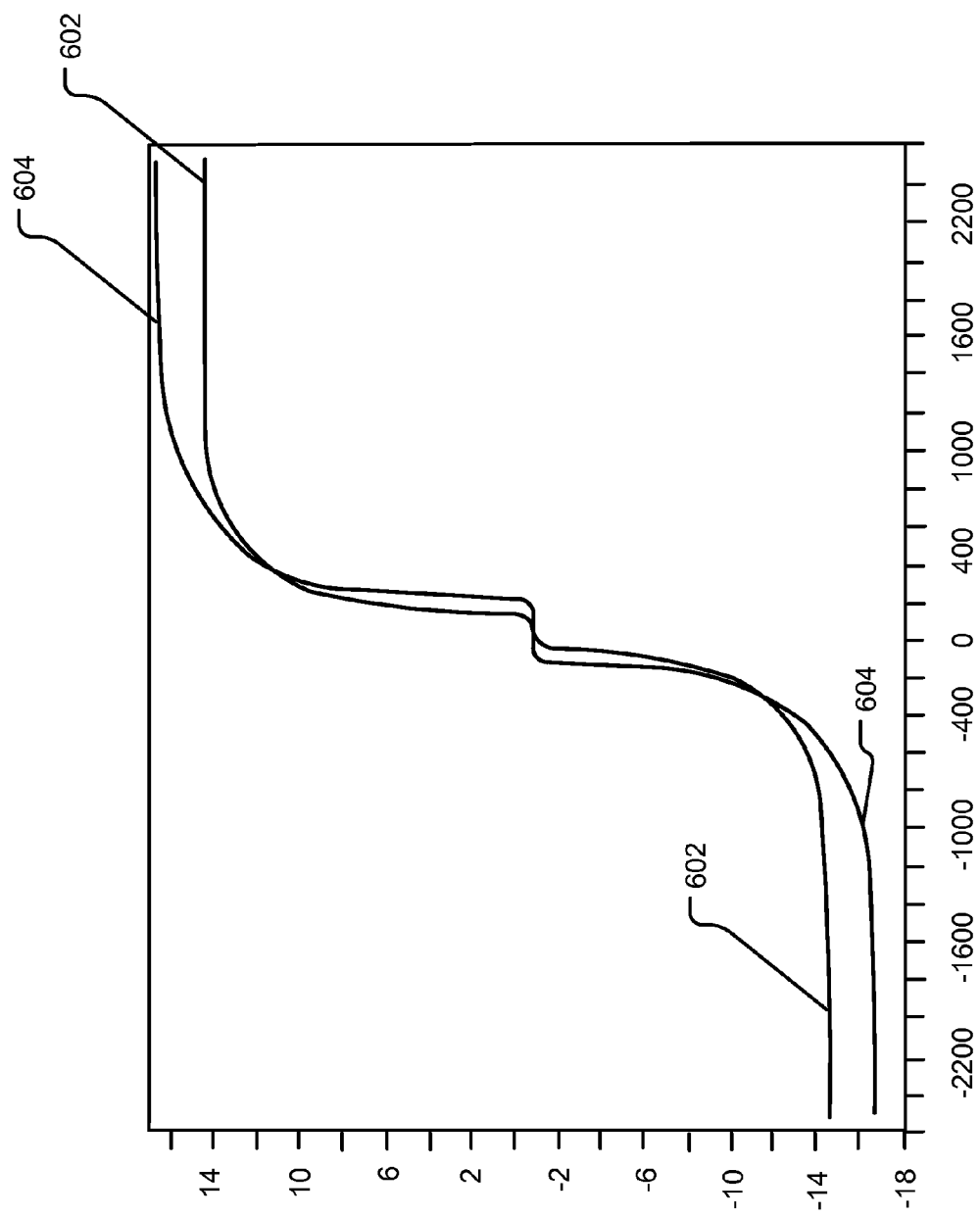
FIG. 6 illustrates magnetization for two different SAF structures under an applied magnetic field.

FIG. 6 illustrates magnetization behavior for two different SAF structures under an applied magnetic field. A first SAF structure, with data shown by line 602, includes layers of NiFe antiferromagnetically coupled together. A second SAF structure, with data shown by line 604, includes layers of CoFeNb antiferromagnetically coupled together. The plot shows that the SAF structure including the CoFeNb has a higher saturation field, which is indicative of an improved RKKY coupling. Also, the data shows that the SAF structure including the CoFeNb has a higher nucleation field than the SAF structure including the NiFe.

The above specification, examples, and data provide a complete description of the structure and use of exemplary implementations of the invention. Since many implementations of the invention can be made without departing from the spirit and scope of the invention, the invention resides in the claims hereinafter appended.

What is claimed is:

1. A magnetoresistive (MR) sensor comprising:
a synthetic antiferromagnetic (SAF) structure magnetically coupled to a side shield element, the SAF structure comprising:
a first amorphous alloy layer that includes a ferromagnetic material and a refractory material, and
a crystalline ferromagnetic layer in contact with the first amorphous alloy layer.

2. The MR sensor of claim 1, wherein the crystalline ferromagnetic layer has a first surface in contact with the first amorphous alloy layer and a second opposite surface in contact with a second amorphous alloy layer.

3. The MR sensor of claim 2, wherein the first amorphous alloy layer has a thickness less than half of the thickness of the crystalline ferromagnetic layer.

4. The MR sensor of claim 1, wherein the refractory material is selected from the group consisting of tantalum, niobium, hafnium, and zirconium.

5. The MR sensor of claim 1, wherein the SAF structure is included between a shield element and a leading edge of a sensor stack.

6. The MR sensor of claim 1, wherein the SAF structure is included between a shield element and a trailing edge of a sensor stack.

7. The MR sensor claim 1, wherein the amorphous alloy layer is in contact with a spacer coupling layer.

8. The MR sensor of claim 1, wherein the amorphous alloy layer is anti-ferromagnetically coupled to another amorphous alloy layer.

9. The MR sensor of claim 1, wherein the amorphous alloy layer is in contact with an antiferromagnetic (AFM) layer.

10. The MR sensor of claim 1, wherein the amorphous alloy layer comprises less than 30 percent refractory material.

11. The MR sensor of claim 1, wherein the crystalline ferromagnetic layer is in contact with a spacer coupling layer.

12. The MR sensor of claim 1, wherein the crystalline ferromagnetic layer is in contact with an antiferromagnetic (AFM) layer.

13. A magnetoresistive (MR) sensor comprising:
a synthetic antiferromagnetic (SAF) structure including an amorphous alloy layer including a ferromagnetic material and a refractory material, a first crystalline ferromagnetic layer, and a coupling spacer layer in contact with the first crystalline layer, wherein the SAF structure is magnetically coupled to side shields of the MR sensor.

14. The MR sensor of claim 13, wherein the refractory material is selected from the group consisting of tantalum, niobium, hafnium, and zirconium.

15. The MR sensor of claim 13, wherein the SAF structure is magnetically decoupled from a shield adjacent to a trailing edge of the MR sensor.

16. The MR sensor of claim 13, wherein the coupling spacer layer has a first surface in contact with the first crystalline ferromagnetic layer and a second opposite surface in contact with a second crystalline ferromagnetic layer.

17. The MR sensor of claim 13, wherein the SAF structure is included between a shield element and a leading edge of a sensor stack.

18. The MR sensor of claim 13, wherein the SAF structure is included between a shield element and a trailing edge of a sensor stack.

19. A magnetoresistive (MR) sensor comprising a SAF structure, a sensor stack, and side shields, the SAF structure comprising:
a pinned layer including alternating layers of magnetic crystalline material and magnetic amorphous material including a ferromagnetic material and a refractory material;
a reference layer including alternating layers of magnetic crystalline material and magnetic amorphous material; and
a coupling spacer layer between the pinned layer and the reference layer and in contact with magnetic crystalline material on two opposite surfaces;
with the SAF structure magnetically coupled to the side shields.

20. The MR sensor of claim 19, wherein the SAF structure is included between a shield element and a trailing edge of the sensor stack.

* * * * *